United States Patent [19]

Breedlove et al.

[11] 4,101,824

[45] Jul. 18, 1978

[54] TEST CELL HOLDER

[75] Inventors: Harold W. Breedlove, Woodbridge; Walter L. Brown, Alexandria, both of Va.

[73] Assignee: The United States of America as represented by the Secretary of the Army, Washington, D.C.

[21] Appl. No.: 731,592

[22] Filed: Oct. 12, 1976

[51] Int. Cl.² .................................................. G01R 31/024
[52] U.S. Cl. .................................. 324/20 R; 324/158 F
[58] Field of Search ................. 324/20 R, 20 CR, 24, 324/25, 158 D, 158 F, 158 T; 350/247, 318; 356/244, 256

[56] References Cited

U.S. PATENT DOCUMENTS 3,806,259  4/1974  Boostrom ............................ 356/244

Primary Examiner—M. Tokar
Attorney, Agent, or Firm—Nathan Edelberg; John E. Holford; Robert P. Gibson

[57] ABSTRACT

A test assembly and wafer tube holder are provided to permit comparative tests of each elemental surface portion of a tube target as a function of position thereon and as a function of the lifetime of the tube.

8 Claims, 2 Drawing Figures

TEST CELL HOLDER

The invention described herein may be manufactured, used, and licensed by the U.S. Government for governmental purposes without the payment of any royalties thereon.

BACKGROUND OF THE INVENTION

The evolution of light imaging devices and light detectors of the vacuum tube variety has led to a simple cylindrical tube of diameter much larger than its thickness known as a wafer tube. This design provides the largest area for imaging and the smallest volume for ease of evacuation, as well as economy of space in a system. To reduce contact resistance and increase contact reliability two or more toroidal electrodes of slightly different diameters are mounted on the outside of the narrow circumferential wall and sealed therethrough to provide inner terminals, leaving both circular tube walls free for optical purposes, if needed. Electro-optical targets such as photocathodes, photodiodes, photoconductors, electron multipliers and phosphor screens are mounted in the tube and connect to these inner terminals.

To test such devices it is usual to set up a standard source and a socket with spring contacts a fixed distance therefrom, into which contacts the tubes are inserted and tested. Such a setup is not suitable in critical tests of experimental devices for a number of reasons. First the resistance of the spring contacts can vary causing the applied voltage or signal extracted (depending on the device under test) to vary from test to test. The distance from the source to tube can also vary. It may be desirable to have the light incident from opposite directions for particular measurements. And finally the augular orientation of tube can also vary in tests where comparison of elemental areas of the target surface are of interest.

BRIEF DESCRIPTION OF INVENTION

An object of the invention is to provide a test assembly which provides accurate comparative data on the same tube at various times in its life and similar data on other tubes over the same total test time.

A further object is to provide a holder for wafer tubes which facilitates the above testing.

BRIEF DESCRIPTION OF DRAWINGS

The invention is best understood with reference to the attached drawings wherein.

DESCRIPTION OF THE INVENTION

Figure 1:
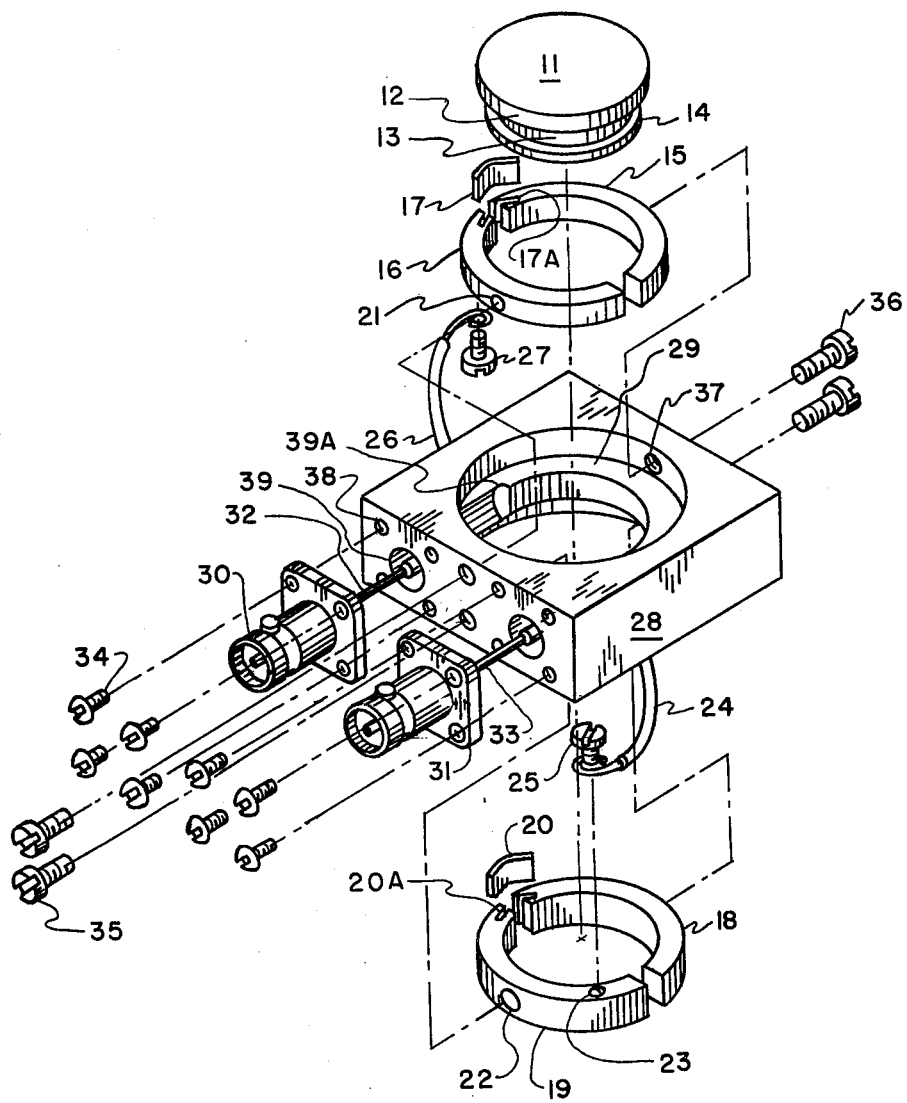
FIG. 1 shows a holder for wafer tubes designed for use in the test assembly of FIG. 2.

Referring specifically to FIG. 1 there is shown the outline of a standard wafer tube or test cell 11, the term "test cell" as used herein includes empty tube envelopes and partially completed tubes with the photosensitive device and a readout collector. It is generally cylindrical, but has toroidal electrodes 12 and 14 which protrude radially beyond the circumferential side wall 13 of the cell. Electrode 12 protrudes slightly more than electrode 14 so that the two can readily be distinguished and thereby avoids improper polarization of the power applied or signals extracted from these electrodes. The remainder of FIG. 1 is devoted to a holder for such tube to facilitate testing. The cell in some instances may contain a photodiode which generates a small signal in response to light or a photoresistor to control the flow of current, either of which can be monitored by any suitable commercially available meter and/or recording device. On the other hand, the cell may contain a photocathode, electron accelerator and/or multiplier and a phosphor screen to intensify a faint light image in a manner well known in the art, and such would require a light detector and possibly recording equipment which are also readily available in the art. Applicant's holder is suitable for any of these.

The holder consists basically of a frame member 28 to which the remaining elements in FIG. 1 are attached. The frame is preferably, but not necessarily symmetrical about an optical axis through the center of cell 11 when it is seated therein. The main requirement of the overall shape of the frame is that its outer general cross-section normal to a sliding axis be uniform along that axis. This sliding axis in FIG. 1 is parallel to the face of the frame containing the numeral 28. This general cross-section does not take into account the many openings drilled into the frame, but is best pictured by considering the frame as a simple block before such openings have been added. For economy it is best to make the frame member as close to the cell dimensions as possible, particularly in that dimension parallel to the optical axis, but never less than these dimensions. To simplify electrical connections the frame is best made from a block of non conducting material such as polystyrene or polytetrafluoroethylene, it can be made from metal if insulators are provided for the various electrodes mounted thereon.

After the outer shape of the block is formed by molding and/or machining, the remaining features are applied by drilling and tapping. The block is drilled less than halfway through along the optical axis from both sides. As shown in FIG. 1, it is drilled to a larger diameter on the top side than on the bottom, the drill diameters being greater by substantially equal increments than the top and bottom electrodes, of the cell 11. The remaining center portion of the frame is then drilled along the optical axis with a drill diameter to provide a free sliding fit for the smaller cell electrode 14. These drillings provide a cell socket having a shoulder 29 against which the larger electrode rests when the cell is approximately centered in the frame. When testing a single thin planar device within the cell, the shoulder can be located so that the device is equidistance from both broad surfaces of the frame block. As will be seen, this makes it possible to test the device for light transmission in opposite directions (in a complete test assembly) without refocussing the test light image. Another advantageous effect can be obtained for two back-to-back planar parallel devices in the same tube by placing the shoulder so that each device is spaced an equal distance from the broad wall it faces. The thickness of the block is chosen for each shoulder placement so that the tube does not protrude beyond the frame. Two large wiring holes 39 are then drilled through a terminal face of the frame member with the hole and sliding axes parallel. The holes are located to open into the socket while removing a portion of the shoulder to a stop face 39 substantially at the plane through the optical axis normal to the sliding axis. Additional small mounting holes 39, four are shown, are drilled into the terminal face of the frame around each of the larger wiring holes and tapped for mounting screws 34. Two pairs of set screw holes 37 are drilled and tapped through the frame parallel to the sliding axis, one pair through the terminal face and a second pair from the opposite face of the frame. One screw 36 of each pair extends into the socket above shoulder 29 and the other 35 below it, the axes of all screws substantially intersect the optical axis.

Electrical contact to the cell is effected through large and small coaxial toroidal socket electrodes. The larger socket electrode, consisting of two half toroids 15 and 16 equally spaced a small fraction of their diameter from a parting plane through the optical axis normal to the sliding axis and connected by a spring hinge 17 inserted in slots 17a at two adjacent ends thereof, has an axial dimension slightly less than the socket portion above shoulder 29 and a minimum diameter somewhat greater than the larger tube electrode. The maximum diameter of the toroids is smaller than the adjacent socket diameter such that the socket electrode, which is biased radially outward toward the socket walls by the spring hinge, will provide an easy sliding fit for the large cell electrode. The smaller socket electrode consisting of similar parts 18, 18a, 19 and 20 is likewise dimensioned with respect to the portion of the socket below the shoulder and the smaller electrode of the tube. Small indentations such as 21 and 22 are provided in each half toroid to engage the end of set screws 36 and thereby prevent axial displacement of the socket electrodes. After the tube is positioned in the socket the set screws 36 are advanced into the socket to clamp the various electrodes together.

To provide an external electrical connection lead wires 24 and 26 are secured to the large and small electrodes by means of set screws 25 and 27 engaging threaded holes such as tapped hole 23 provided for that purpose adjacent the removed shoulder ending at stop face 39a. The opposite end 32 of the leads are extended through wiring holes 39 and electrically coupled to the terminal electrodes 30. The BNC terminals shown were chosen for their reliability and low contact resistance. These terminals have flanges 31 with holes to match holes 38 and mounting screws 34, which complete the assembly. Two electrodes satisfy most test requirements, but additional coaxial electrodes having the same general structure may be added as long as their combined axial dimension does not approach too closely the same dimension of the cell.

Figure 2:
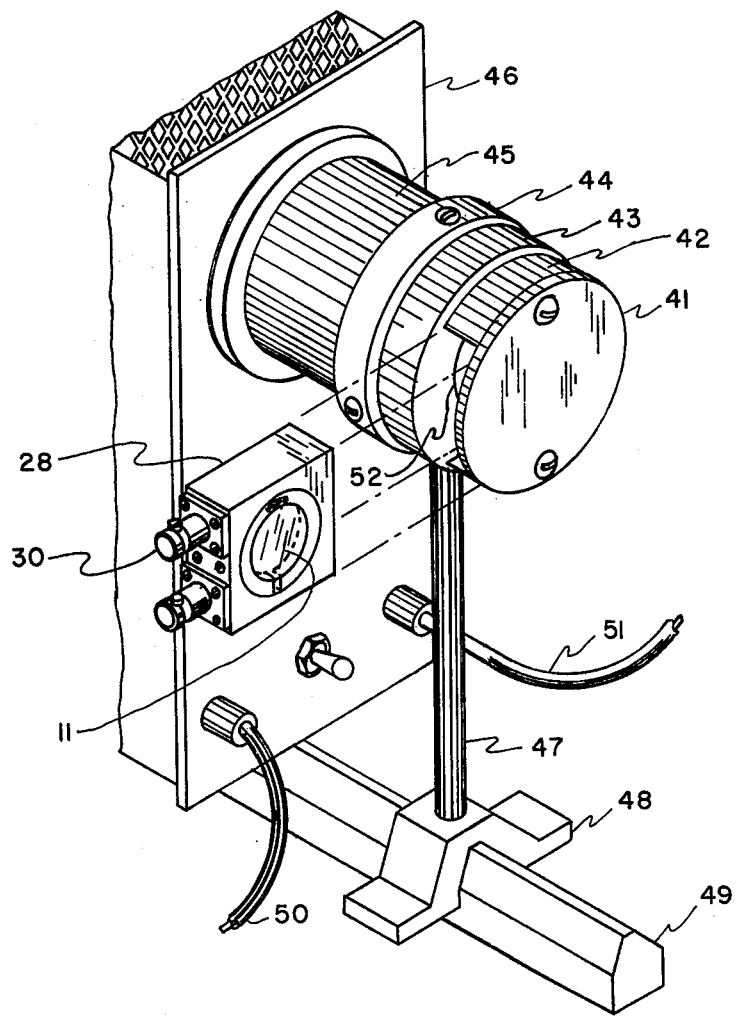
FIG. 2 shows the main features of a complete test assembly according to the present invention.

FIG. 2 shows a test assembly using the holder of FIG. 1. A mating passageway for the holder is provided by the circular end plate 41 two spacers 42 and a first hollow cylindrical pipe member 43 having an annular end wall defining an aperture 42 substantially equal to the cell diameter. Pipe 43 is coupled to a second pipe member 45 by means of an optical coupling ring 44 which contains a lens (not shown) to focus a light source onto the target in the test cell. In the present invention the source is preferably the screen of a cathode ray oscilliscope 46 or other cathode ray tube (CRT). The outer diameters of the cylindrical elements 41–45 and the corresponding diagonal measurement of the frame 28 are preferably matched to the approximate diameter of the CRT screen. The members 41–45 are thin walled and opaque for obvious reasons. A standard optical bench comprising a support stem 47 attached to ring 44 and sliding support 48 on optical bench member 49 may be used to position the various parts of the assembly. Since the current apparatus is being used to explore the surfaces of photoemissive optical diodes the terminals 30 are connected through appropriate electronics to a sensitive voltage recorder. The oscilloscope has external X and Y input leads 50 and 41 which are fed by low frequency precision sawtooth oscillators (not shown). By focussing the CRT beam to a small dot and scanning the dot over the screen while projecting an image of the screen on the target of the wafer tube, the target response can be tested on the basis of its elemental areas. The same technique can be used on photoconductive or photoresistive devices. For light transmission tests of filters, coating, tube envelopes, image intensifiers, and the like, it is necessary to replace the opaque plate 41 with a translucent one or a plate having a window therein over the area corresponding to the area of the test cell. A light detector could then be positioned to measure, for example, the total radiation from the window area as a function of the CRT beam position.

Since wafer tubes are still in research and early development programs, the present invention is particularly suited for such programs. It is preferable that a test cell be kept in its holder throughout its lifetime. This will insure that the physical parameters of the test do not vary as a result of the cell being reinserted on a daily basis. As previously indicated, the invention is not restricted to complete tubes, but can be used to examine a tube containing only one layer of a multilayered structure such as a photocathode, photodiode phosphor screen or even the tube envelope itself for light transmittance and reflectance. By adjusting the position of the shoulder to accommodate a particular test cell a specific layer in the cell can be placed at a fixed distance from the source even when the holder is rotated 180° about its sliding axis so that directional responses of the layer can accurately be made on a repeated basis. An additional benefit is the ability to stack the cells without damaging their optical faces, which may have special coatings thereon.

Many other embodiments of the above disclosed structures will be immediately apparent to those skilled in the art but the invention is to be limited only as defined in the claims which follow.

We claim:

1. A test assembly for light detecting wafer test cell with circumferential electrodes comprising:
   an optical bench means having an optical axis;
   a standard cathode ray oscilloscope with scanned dot light source mounted on said bench means substantially centered on said optical axis;
   a holding jig mounted on said bench means defining a passageway of a first uniform cross-section extending therethrough normal to said optical axis and also defining an aperture of a second smaller uniform cross-section substantially centered on said axis extending from the jig surface nearest said source into said passageway; and
   a holder for said test cell slideably mounted in said passageway, said holder including,
      a frame member with parallel sides, an outer cross-section normal thereto substantially equal to the cross-section of said passageway and a socket defined therein larger than and facing said aperture, said socket having the same shape but dimensions slightly greater than said test cell,
      a pair of electrical terminals mounted on an external surface of said frame insulated from one another; and fastening means attached to said frame member to secure said test cell in a fixed position within said socket and electrically attach each of said electrodes to a different one of said terminals.

2. A test assembly according to claim 1 wherein:
said holder has a frame member with six orthogonally related sides and said socket is circulary cylindrical.

3. A test assembly according to claim 1 wherein:
said socket and said test cell are circularly cylindrical; and
said fastening means includes two toroical metal clamps in said socket engaging said electrodes.

4. A holder for an optical test cell undergoing life testing comprising:
a frame member having an optical axis as well as a sliding axis normal to and intersecting said optical axis, the cross-section of said frame member normal to said sliding axis being uniform, and an outside wall normal to said sliding axis;
a cylindrical socket formed in said frame member to fit said test cell;
at least one pair of toroidal electrically conducting clamps mounted in said socket; and
test terminals mounted on said wall each electrically connected to a different one of said clamps.

5. A holder according to claim 4 wherein:
said clamps each include two sections on opposite sides of a parting plane through their axis, said two sections being connected by a hinge spring at one end thereof urging said opposite ends away from said parting plane; and
said frame member includes screws threaded therein each in contact with a different one of said clamp sections to urge it toward said parting plane.

6. The holder according to claim 4 wherein:
said socket consists of at least first and second cylindrical apertures of large and small diameters, respectively, drilled less than halfway through said frame coaxial with said optical axis, and a third coaxial aperture of lesser diameter drilled through the remainder of said frame, and
said frame has a thickness substantially equal to said test cell, whereby said cell may be inserted small diameter end first into said large diameter side of said socket to rest against a shoulder provided by large and lesser diameter apertures.

7. The holder according to claim 6 wherein said test cell contains one or more planar devices defining two test surfaces:
said shoulder being located so that said test surfaces are both equidistance from the nearest broad surface of said frame.

8. A test assembly according to claim 1 wherein:
a recording means is coupled to said test cell to record the electrical response of said test cell to scanned dot light source.

* * * * *